US010664271B2

(12) United States Patent
Muralimanohar et al.

(10) Patent No.: US 10,664,271 B2
(45) Date of Patent: May 26, 2020

(54) DOT PRODUCT ENGINE WITH NEGATION INDICATOR

(71) Applicant: Hewlett Packard Enterprise Development LP, Houston, TX (US)

(72) Inventors: Naveen Muralimanohar, Santa Clara, CA (US); Ali Shafiee Ardestani, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/073,650

(22) PCT Filed: Jan. 30, 2016

(86) PCT No.: PCT/US2016/015850
§ 371 (c)(1),
(2) Date: Jul. 27, 2018

(87) PCT Pub. No.: WO2017/131792
PCT Pub. Date: Aug. 3, 2017

(65) Prior Publication Data
US 2019/0034201 A1  Jan. 31, 2019

(51) Int. Cl.
*G06F 9/30* (2018.01)
*G06F 17/16* (2006.01)
(Continued)

(52) U.S. Cl.
CPC ........ *G06F 9/30036* (2013.01); *G06F 9/3001* (2013.01); *G06F 17/16* (2013.01);
(Continued)

(58) Field of Classification Search
CPC .... G06F 9/30036; G06F 9/3001; G06F 17/16; G06N 3/063; H03M 3/50
(Continued)

(56) References Cited

U.S. PATENT DOCUMENTS 7,720,160 B1   5/2010  Gorecki et al.
8,749,422 B1   6/2014  Moore
(Continued)

FOREIGN PATENT DOCUMENTS

CN       103312331        9/2013
WO    WO-2013101018 A1    7/2013

OTHER PUBLICATIONS

Gao, L. et al., "Analog-Input Analog-Weight Dot-Product Operation With Ag/a-Si/Pt Memristive Devices", (Research Paper), VLSI-SoC, 2012, pp. 88-93, 6 Pages.
(Continued)

*Primary Examiner* — Tan V Mai
(74) *Attorney, Agent, or Firm* — Dicke, Billig & Czaja, PLLC

(57) ABSTRACT

Examples disclosed herein include a dot product engine, which includes a resistive memory array to receive an input vector, perform a dot product operation on the input vector and a stored vector stored in the memory array, and output an analog signal representing a result of the dot product operation. The dot product engine includes a stored negation indicator to indicate whether elements of the stored vector have been negated, and a digital circuit to generate a digital dot product result value based on the analog signal and the stored negation indicator.

20 Claims, 5 Drawing Sheets

(51) Int. Cl.
    *G06N 3/063*     (2006.01)
    *G06J 1/00*     (2006.01)
    *H03M 3/00*     (2006.01)

(52) U.S. Cl.
    CPC ............... *G06J 1/00* (2013.01); *G06N 3/063* (2013.01); *H03M 3/50* (2013.01)

(58) Field of Classification Search
    USPC ........................................................ 708/801
    See application file for complete search history.

(56) References Cited

U.S. PATENT DOCUMENTS

| | | | |
|---|---|---|---|
| 8,959,136 | B1 | 2/2015 | Cheung et al. |
| 2006/0149804 | A1 | 7/2006 | Luick et al. |
| 2007/0229111 | A1 | 10/2007 | Mouttet |
| 2010/0332812 | A1 | 12/2010 | Burger et al. |
| 2013/0028004 | A1 | 1/2013 | Snider |
| 2015/0170025 | A1 | 6/2015 | Wu et al. |
| 2015/0347896 | A1* | 12/2015 | Roy ........................ G11C 11/54 365/148 |
| 2017/0178725 | A1* | 6/2017 | Yang .................... G11C 13/003 |
| 2017/0220526 | A1* | 8/2017 | Buchanan ............. G06F 7/5443 |
| 2017/0316827 | A1* | 11/2017 | Ge ....................... G11C 7/1006 |

OTHER PUBLICATIONS

International Search Report & Written Opinion received in PCT Application No. PCT/US2016/015850, dated Nov. 7, 2016, 14 pages.
Strachan, "The Dot-Product Engine (OPE); exploring high efficiency analog multiplication with memristor arrays", Fourth Rebooting Computing Summit, Dec. 11, 2015, 29 pgs.
Liu, X. et al, "A Heterogeneous Computing System With Memristorbased Neuromorphic Accelerators" 2014 IEEE High Performance Extreme Computing Conference, Sep. 9-11, 2014, 6 pgs.
Anonymous: "Ones'omplement—Wikipedia", , Dec. 3, 2015 (Dec. 3, 2015), XP055570734, Retrieved from the Internet: URL: https://en.wikipedi.org/windex.php? title=Ones'omplement8 oldid=693553205 [retrieved on Mar. 18, 2019].
Extended European Search Report, EP Application No. 16888520.0, dated Mar. 26, 2018, pp. 1-10, EPO.
Office Action, EP Application No. 16888520,0, dated Nov. 2, 2016, pp. 1-6, EPO.
Wikipedia, "Negation," Dec. 30, 2015, pp. 1-6 (online), Retrieved from the Internet on Oct. 26, 2018 at URL: <en.wikipedia.org/w/index.php?title=Negation&oldid=697358623#Programming>.
Wikipedia, "Two's Complement," Dec. 22, 2015, https://en.wikipedia.org/w/index.php?title=Two's_complement&oldid=696335761.

\* cited by examiner

DOT PRODUCT ENGINE WITH NEGATION INDICATOR

BACKGROUND

Machine learning techniques have recently grown in prominence—they are frequently employed for mobile applications, as well as for data analysis in back-end data centers. Architectures that are optimized for machine learning techniques, e.g., convolutional neural networks (CNNs) and the more general deep neural networks (DNNs), can therefore have high impact. Machine learning techniques are amenable to acceleration because of the high degree of compute parallelism. Machine learning techniques, such as those involving convolutional CNNs and DNNs, typically involve a large number of multiply-accumulate (i.e., dot product) operations. The dominant data structures in CNNs and DNNs are the synaptic weight matrices that define each neuron layer.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Some examples disclosed herein are directed to an in-situ processing approach for dot product computations, where memristor crossbar arrays not only store input weights, such as synaptic weights for convolutional neural networks (CNNs) or deep neural networks (DNNs), but are also used to perform dot product operations in an analog manner. This is, therefore, an example of in-situ computing. Crossbar arrays using resistive memory are effective at performing many dot product operations in parallel. Such a dot product engine is analog in nature, essentially leveraging Kirchoff's Law to yield a bitline current that is a sum of products.

In a memristor dot product engine, three components dominate the total power: (1) Initialization of the dot product engine; (2) Analog-to-Digital Converters (ADCs); and (3) Digital-to-Analog Converters (DACs). If the cost of initializing a dot product engine is amortized across multiple computations, and the DAC connected to each row is eliminated by using 1-bit signals for the input operand vector, then the ADC is the highest overhead component.

The energy consumed by the ADC is a function of precision of the ADC (i.e., number of bits in the digital output of the ADC). Some examples disclosed herein use a data encoding technique that is amenable to analog computations and that can reduce the high overheads of analog-to-digital conversion in a memristor dot product engine. Some examples use data encoding to increase the ADC accuracy by one bit. This translates to a two times increase in the height of the memristor array, or having one more bit per cell without losing precision, or relaxing the ADC specification by one bit (e.g., using a 6-bit ADC rather than a 7-bit ADC). As a result, computation efficiency increases.

Figure 1:
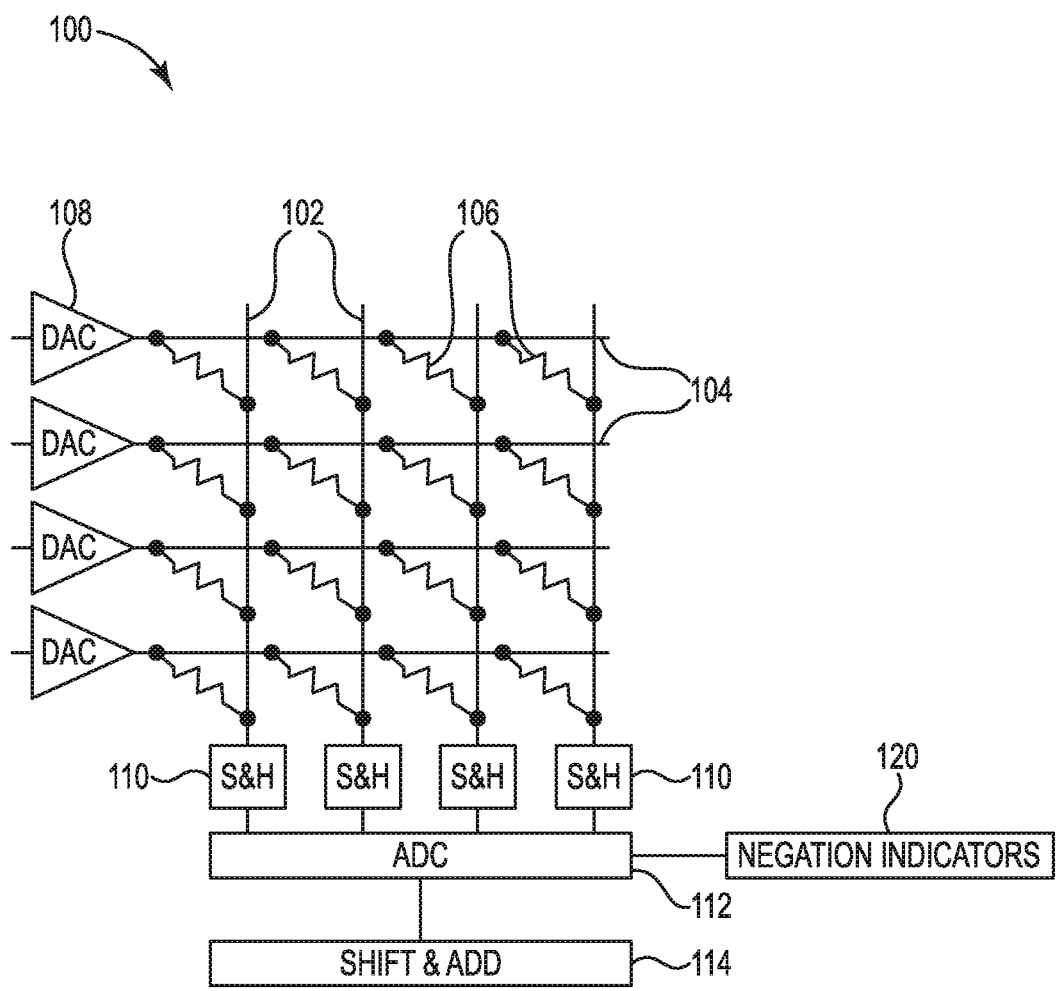
FIG. 1 is a schematic diagram illustrating a memristor dot product engine according to one example.

FIG. 1 is a schematic diagram illustrating a memristor dot product engine 100 according to one example. Dot product engine 100 includes a plurality of bitlines 102, a plurality of wordlines 104, a plurality of resistive memory cells 106, a plurality of DACs 108, a plurality of sample-and-hold (S&H) circuits 110, an ADC 112, a shift and add circuit 114, and negation indicators 120. In some examples, the S&H circuits 110 may be part of the ADC 112. As shown in FIG. 1, every bitline 102 is connected to every wordline 104 via resistive memory cells 106. Digital input values are provided to DACs 108, which convert the digital input values to corresponding analog voltage levels, which are output on word lines 104. Assume that the cells 106 in the first column are programmed to resistances R1, R2, . . . , Rn. The conductances of these cells 106 are G1, G2, . . . , Gn, which are the inverses of their resistances. If voltages V1, V2, . . . , Vn are respectively applied to each of the wordlines 104, cell i passes current Vi·IRi, or Vi×Gi into the bitline 102, based on Kirchoff's Law. FIG. 1 is described in further detail below after a description of FIG. 2.

Figure 2:
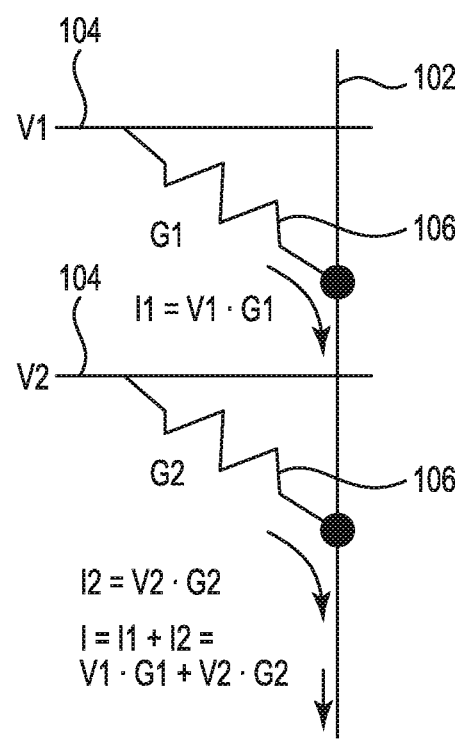
FIG. 2 is a schematic diagram illustrating the use of a bitline of the dot product engine shown in FIG. 1 to perform an analog sum of products operation according to one example.

FIG. 2 is a schematic diagram illustrating the use of a bitline of the dot product engine 100 shown in FIG. 1 to perform an analog sum of products operation according to one example. As shown in FIG. 2, the total current emerging from the bitline 102 is the sum of currents (I1+I2) passed by each cell 106 in the column. This current, I, represents the value of a dot product operation, where one vector is the set of input voltages at each wordline 104 (i.e., V1 and V2), and the second vector is the set of cell conductances, G1 and G2, in a column, i.e., I=V×G=V1·G1+V2·G2.

The input voltages are applied to all the rows. The currents emerging from each bitline 102 can therefore represent the outputs of neurons in multiple CNN output filters, where each neuron is fed the same inputs, but each neuron has a different set of synaptic weights (encoded as the conductances of cells 106 in that column). The dot product engine 100 shown in FIG. 1 achieves very high levels of parallelism—an m×n crossbar array may perform dot products on m-entry vectors for n different neurons in a single step, i.e., it performs vector-matrix multiplication in a single step.

Each bitline 102 is coupled to one of the sample-and-hold circuits 110, which receives the bitline current and feeds it to the shared ADC 112. The conversion of analog currents to digital values by ADC 112 facilitates communication of the dot product results to other digital units. Shift and add circuit 114 may perform additional processing of the digital dot product results.

To perform a lossless computation in a dot product engine, the ADC precision (i.e., the number of bit returning from the ADC per sample) should be a function of the number of levels in DAC, the height of the memristor array, and the number of bits per cell. For example, with a 7-bit ADC, a memristor array of size 128×128 can store one bit per cell with a binary DAC. In general the ADC precision is given by the following Equation I:

$$ADC \text{ precision} = \log(H) + \log(dac_{bits}) + pbc \quad \text{Equation I}$$

Where:
H=height of the memristor array;
$dac_{bits}$=number of bits per DAC; and
pbc=number of bits per cell.

Additionally, ADC power, area, and bandwidth have a super-linear relationship with its precision. As a result, any effort to reduce the ADC output precision will increase computation efficiency dramatically. If the number of bits per cell, pbc, or the number of bits per DAC, $dac_{bits}$, or both, are 1, Equation I will be slightly different, as shown in the following Equation I-2, where ADC precision in Equation I represents the same thing as ADCbits in Equation I-2:

$$ADCbits = \begin{cases} \log2(N_R) + DAC_b + M_b & \text{if } DAC_b > 1 \\ \log2(N_R) + M_b & \text{if } DAC_b = 1 \\ \log2(N_R) + DAC_b & \text{if } M_b = 1 \end{cases} \quad \text{Equation I-2}$$

Where:
$N_R$=height of the memristor array;
$DAC_b$=number of bits per DAC; and
$M_b$=number of bits per cell.

In the following, it will be shown that an encoding method can increase ADC precision by one bit. Assume a H×w ($H=2^h$) memristor array with d bits per DAC, and c bits per cell. To perform precise computation, it is assumed that ADC precision is h+d+c. Also, it is assumed that the weights stored in one column and the inputs to the memristor array are $w_0, w_1, \ldots w_{H-1}$ and $a_0, a_1, \ldots, a_{H-1}$, respectively. The calculation in this column is represented by the following Equation II:

$$sum = a_0 \times w_0 + \ldots + a_{H-1} \times w_{H-1} \quad \text{Equation II}$$

In Equation II, sum is the output of the column, and appears as a current on the bitline. The upper bound on sum is given by the following Equation III:

$$sum = \sum_{i=0}^{H-1} a_i w_i < (2^d - 1) \sum_{i=0}^{H-1} w_i < H \times (2^d - 1)(2^c - 1) \quad \text{Equation III}$$

since $a_i \leq 2^d - 1$ and $w_i \leq 2^c - 1$

The maximum value of sum has h+d+c bits and is achieved when all inputs and weights are their maximum values. It appear as a maximum current, $I_{max}$, passing through the ADC. The most significant bit (MSB) bit of the ADC output is 1 if sum$\geq 2^{h+d+c-1}$.

The coding approach according to some examples applies the following two steps: (1) It ensures that sum$<2^{h+d+c-1}$, which forces the MSB to 0 and the maximum current to $$\frac{I_{max}}{2};$$

and (2) All weights are multiplied by 2 by reducing the corresponding cell resistance to half. This acts like a shift left operation. As a result, the maximum current will be $I_{max}$ again. In addition, it ignores the always zero MSB of the prior step and provides one more LSB bit in ADC.

The first step mentioned above relies on the following lemma:

Lemma: if $W = \sum_{i=0}^{H-1} w_i$, $\overline{W} = \sum_{i=0}^{H-1} \overline{w}_i$ where $\overline{w}_i = 2^c - 1 - w_i$, then either sum$<2^{h+d+c-1}$ or $\overline{sum} < 2^{h+d+c-1}$ is true, where $\overline{sum} = \sum_{i=0}^{H-1} a_i \times \overline{w}_i$.

Proof: assume min=MIN(sum,$\overline{sum}$) then we have:

$$2 \times \min \leq sum + \overline{sum} =$$

$$\sum_{i=0}^{H-1} a_i w_i + \sum_{i=0}^{H-1} a_i \overline{w}_i = \sum_{i=0}^{H-1} a_i (w_i + \overline{w}_i) = (2^c - 1) \sum_{i=0}^{H-1} a_i$$

$$2\min \leq (2^c - 1) \sum_{i=0}^{H-1} a_i \leq H \times (2^c - 1) \times (2^d - 1) < 2^h \times (2^c - 1) \times 2^d \rightarrow$$

$$\min < 2^{h+d+c-1}$$

Therefore, to achieve the first step, if the summation leads to an MSB of 1, all of the weights are negated (e.g., logical ones are changed to logical zeros, and logical zeros are changed to logical ones). The coding approach keeps one bit per column indicating whether the original weights are stored or the negated weights are stored, and these bits are represented in FIG. 1 by negation indicators 120. These negation indicator bits are kept in a negation table.

With these two steps, ADC precision is increased by one bit. However, if the weights are negated in a given column, then the output will not be what is expected. The correct output can be rebuilt based on the output of the column with negated weights, as shown in the following Equation IV:

$$sum + \overline{sum} = (2^c - 1) \sum_{i=0}^{H-1} a_i \rightarrow sum = (2^c - 1) \sum_{i=0}^{H-1} a_i - \overline{sum} \quad \text{Equation IV}$$

In other words, the original sum can be derived if the sum of input values is available. To find the sum of input values, one more column (or more) can be added to the memristor array with all the weights in that column equal to one. As a result, this column's output will be the sum of inputs. Before converting any analog values to digital, this column's value is first converted and stored in an input sum register. Then, for other columns, while the ADC performs conversions, the bit associated with this column in the negation table is checked, and if the column is stored in the negated format, then the method subtracts the ADC output from the input sum register to find the result.

The overhead associated with this approach is a W-bit negation table, which can be realized with memristor technology, a (h+d+c)-bit input sum register, and a (h+d+c)-bit subtraction circuit. The performance overhead with this approach equals the time for converting one column from analog to digital. Note that since ADC circuits are big, and ADC is typically shared between multiple columns, if the number of columns sharing one ADC is N, then the overhead is 1/N, in terms of performance. In the case that performance overhead is not acceptable or adding one more column is not possible, the sum of inputs can be determined in a digital stage. This would happen in one stage before feeding the number into the memristor array. It would add one stage to the pipeline, and preserve throughputs. It would also add H 1-bit full adders to the approach overhead. However, this digital stage can be shared between many arrays as the speed of the digital stage is typically faster than memristor arrays.

Figure 3:
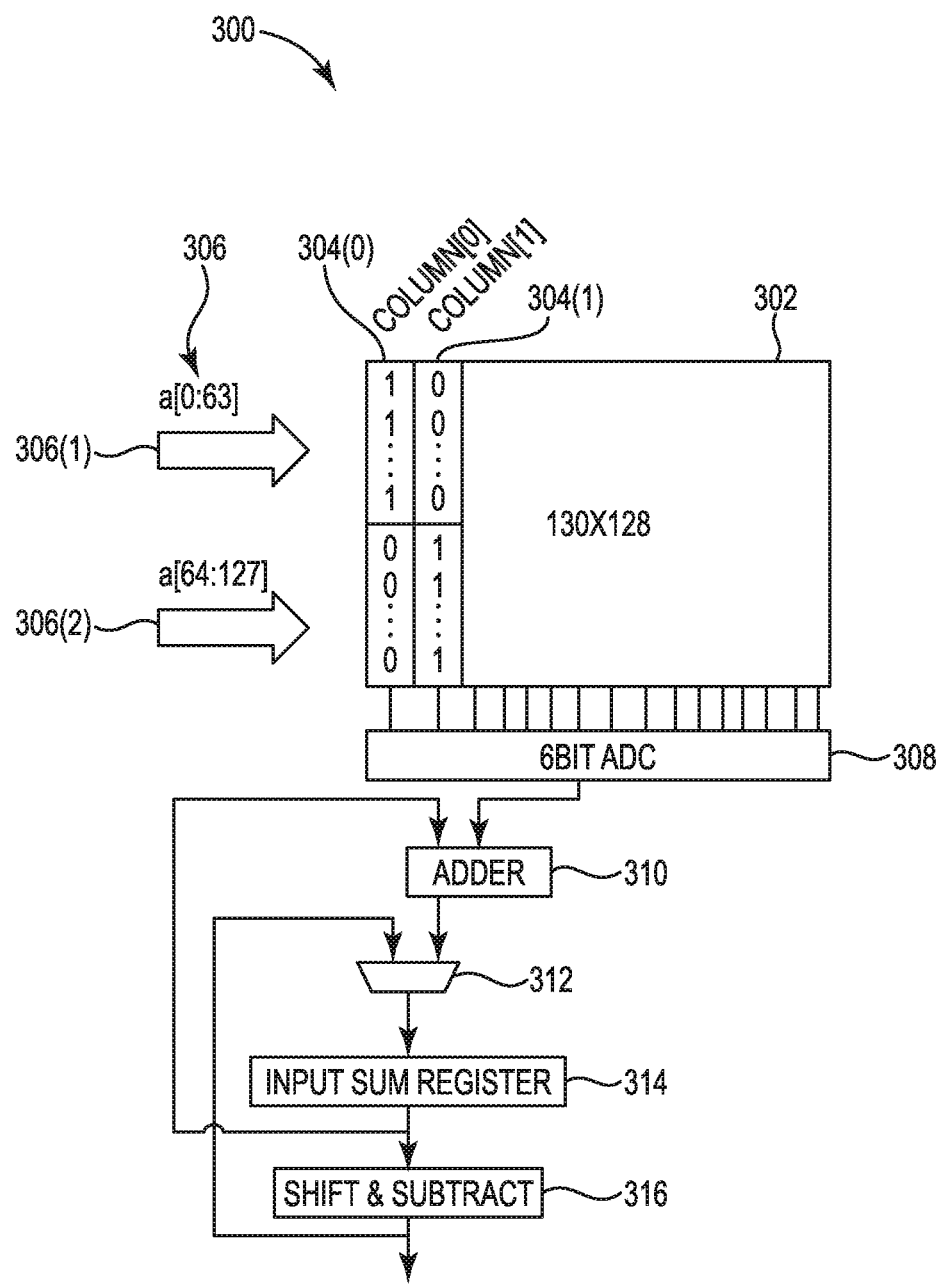
FIG. 3 is a block diagram illustrating elements of a memristor dot product engine that perform a first step of data encoding according to one example.

FIG. 3 is a block diagram illustrating elements of a memristor dot product engine 300 that perform a first step of data encoding according to one example. The dot product engine 300 includes memristor array 302, 6-bit ADC 308, adder circuit 310, multiplexer 312, input sum register 314, and shift and subtract circuit 316. In the illustrated example, two additional columns of cells 304(0) (column[0]) and 304(1) (column [1]) have been added to a 128×128 array to form the 130×128 memristor array 302 that implements data encoding. As discussed above, the data encoding method involves computing the sum of the current input values, $a_i$. As shown in FIG. 3, the input vector 306 is a 128-bit vector, which is divided into input vector portion 306(1) that includes bits 0 through 63, and input vector portion 306(2) that includes bits 64 through 127.

Computing the sum of the current input values is done using the two additional columns 304(0) and 304(1), which both store all logical ones. The input vector portion 306(1) is multiplied by column 304(0), and the result is converted to a first digital value by ADC 308. The first digital value is provided to adder 310, which adds the first digital value to an initial value of zero, and stores the result in the input sum register 314 via multiplexer 312. Next, the input vector portion 306(2) is multiplied by column 304(1), and the result is converted to a second digital value by ADC 308. The second digital value is provided to adder 310, which adds the second digital value to the first digital value, and stores the result in the input sum register 314 via multiplexer 312. The value in the input sum register 314 is then provided to shift and subtract circuit 316, which implements the operation shown in the following Equation V:

$$ISR \leftarrow 2^c \times ISR - ISR \qquad \text{Equation V}$$

As indicated by Equation V, the shift and subtract circuit 316 multiplies the current value (ISR) in the input sum register 314 by $2^c$, where c is the number of bits per cell; subtracts the current value ISR from the result of the multiplication; and stores the result in the input sum register 314 via multiplexer 312. At this point, the input sum register 314 stores the correct value for the sum of the input values.

Figure 4:
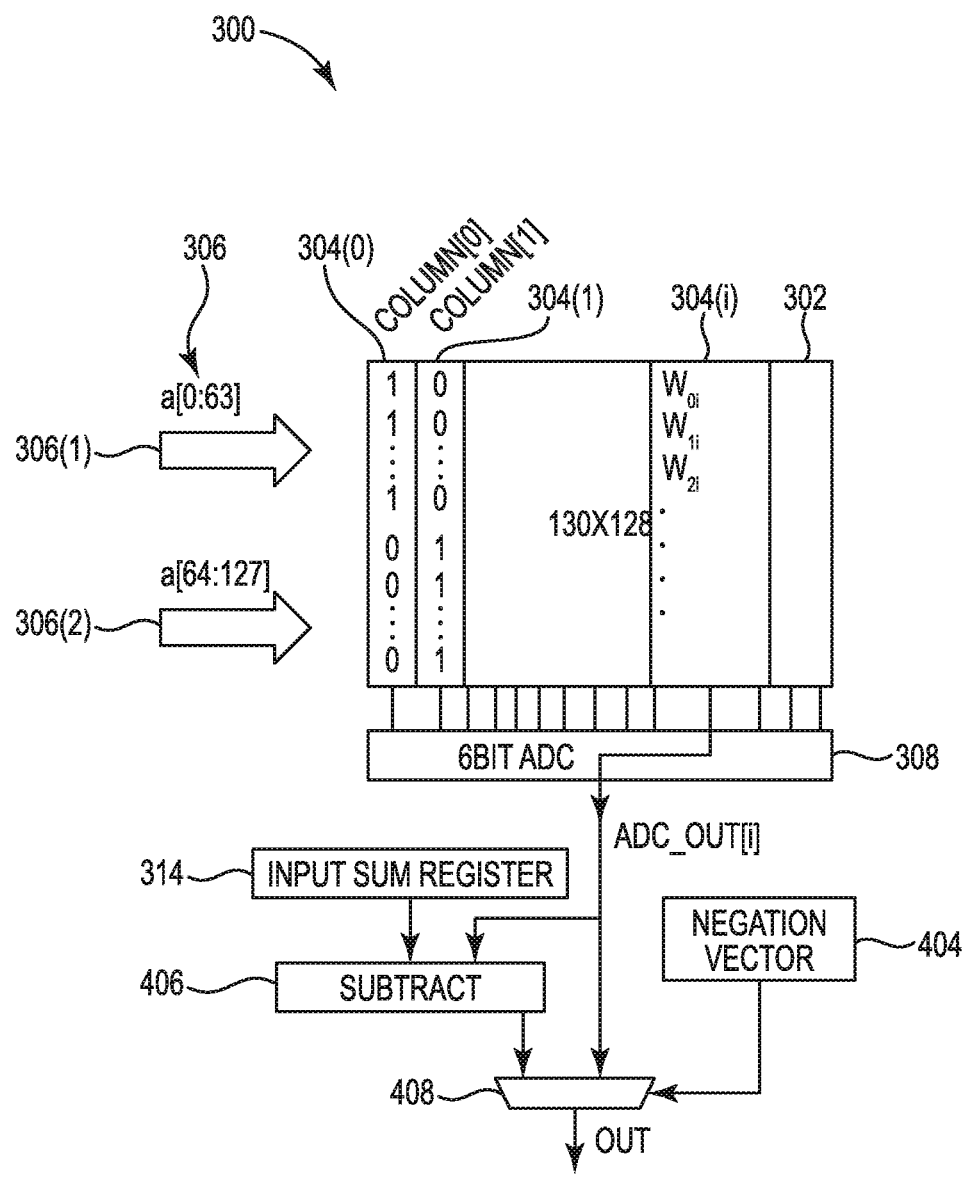
FIG. 4 is a block diagram illustrating elements of the memristor dot product engine shown in FIG. 3 that perform a second step of data encoding according to one example.

FIG. 4 is a block diagram illustrating elements of the memristor dot product engine 300 shown in FIG. 3 that perform a second step of data encoding according to one example. As shown in FIG. 4, in addition to the elements shown in FIG. 3, the dot product engine 300 also includes negation vector 404, subtract circuit 406, and multiplexer 408.

If the weights in any given column of array 302 are collectively large (i.e., with maximal inputs, the sum-of-products yields an MSB of 1), the weights for that column are stored in their negated or flipped form. This results in the MSB of the sum-of-products being 0, and allows the ADC size to be lowered by one bit. The coding approach stores one bit per column indicating whether the original weights are stored or the negated weights are stored. These bits are represented in FIG. 4 by negation vector 404.

ADC 308 outputs digital values to multiplexer 408 and subtract circuit 406. Each digital value represents a sum-of-products for a given column of array 302, such as column 304(i). Subtract circuit 406 subtracts the received digital value from the current value stored in the input sum register 314, and outputs the result to multiplexer 408. For any given column of the array 302, the multiplexer 408 will either output the digital value provided by the ADC 308 or the digital value provided by the subtract circuit 406, depending on the value of the bit corresponding to that column in the negation vector 404. Thus, if the negation vector bit for a given column indicates that the column weights have not been negated and are in their original form, the multiplexer 408 will output the digital value provided directly by the ADC 308. If the negation vector bit for the column indicates that the column weights have been negated, the multiplexer 408 will output the digital value provided by the subtract circuit 406. Thus, regardless of whether the weights of a given column 302 have been negated or not, multiplexer 408 outputs a correct value representing the sum-of-products for the original (non-negated) weights of the column.

The encoding method described herein can be leveraged to reduce ADC resolution, increase cell density, or increase the rows in the memristor array. Because ADC power is a significant contributor to the overall power, and because some ADC overheads grow exponentially with resolution, the impact of this 1-bit reduction in ADC resolution on overall efficiency is significant.

One example of the present disclosure is directed to a dot product engine, which includes a resistive memory array to receive an input vector, perform a dot product operation on the input vector and a stored vector stored in the memory array, and output an analog signal representing a result of the dot product operation. The dot product engine includes a stored negation indicator to indicate whether elements of the stored vector have been negated, and a digital circuit to generate a digital dot product result value based on the analog signal and the stored negation indicator.

The resistive memory array in the dot product engine may store at least one column of all logical ones, and perform a dot product operation on the input vector and the logical ones in the at least one column to generate an analog signal representing a sum of input values. The digital circuit may include an analog-to-digital converter to convert the analog signal representing the sum of input values to a digital input sum value, and to convert the analog signal representing the result of the dot product operation to a first version of the digital dot product result value. The digital circuit may further include an input sum register to store a digital current input sum based on the digital input sum value, and a subtract circuit to subtract the first version of the digital dot product result value from the digital current input sum stored in the input sum register to generate a second version of the digital dot product result value. The digital circuit may further include a multiplexer to selectively output one of the first version or the second version of the digital dot product result value based on the stored negation indicator. The stored negation indicator may be a 1-bit value that is stored as part of a negation vector that indicates for each column of the memory array whether the elements in that column have been negated. The resistive memory array may be a memristor array.

Figure 5:
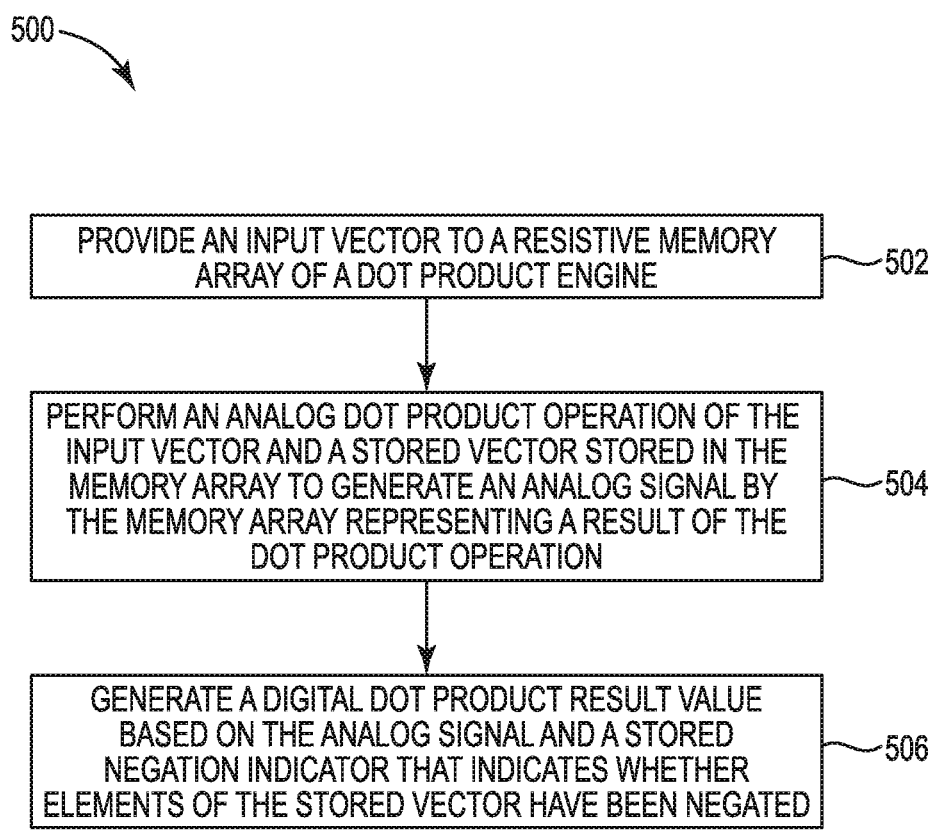
FIG. 5 is a flow diagram illustrating a method for generating a digital dot product result using a resistive memory array according to one example.

Another example of the present disclosure is directed to a dot product method. FIG. 5 is a flow diagram illustrating a method 500 for generating a digital dot product result using a resistive memory array according to one example. In some examples, dot product engine 300 is configured to perform method 500. At 502 in method 500, an input vector is provided to a resistive memory array of a dot product engine. At 504, an analog dot product operation is performed on the input vector and a stored vector stored in the memory array to generate an analog signal by the memory array representing a result of the dot product operation. At 506, a digital dot product result value is generated based on the analog signal and a stored negation indicator that indicates whether elements of the stored vector have been negated.

The method 500 may further include storing at least one vector of logical ones in the resistive memory; and performing an analog dot product operation on the input vector and the at least one vector of logical ones to generate an analog signal representing a sum of input values. The method 500 may further include generating a current digital input sum based on the analog signal representing the sum of input values; and converting the analog signal representing the result of the dot product operation to a first version of the digital dot product result value. The method 500 may further include subtracting the first version of the digital dot product result value from the current digital input sum to generate a second version of the digital dot product result value; and selectively outputting one of the first version or the second version of the digital dot product result value based on the stored negation indicator.

Yet another example of the present disclosure is directed to a memristor dot product engine, which includes a memristor array to receive an input vector, perform a dot product operation on the input vector and a stored vector stored in the memristor array, and output an analog signal representing a result of the dot product operation. The memristor dot product engine includes a register to store an input sum value based on a summation of elements of the input vector, and digital circuitry to generate a digital dot product result value based on the analog signal, the input sum value, and a stored negation indicator that indicates whether elements of the stored vector have been negated.

The memristor array may perform a dot product operation on the input vector and logical ones stored in at least one column of the array to generate an analog signal representing a sum of input values, and the input sum value stored in the register may be generated based on the analog signal representing the sum of input values.

Although some examples disclosed herein are described in the context of memristor technology, other examples may be implemented with another resistive memory technology.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A dot product engine, comprising:
   a resistive memory array to receive an input vector, perform an analog dot product operation on the input vector and a stored vector stored in the memory array, and output an analog signal representing a result of the analog dot product operation;
   a stored negation indicator to indicate whether elements of the stored vector have been negated;
   an analog-to-digital converter to convert the analog signal representing the result of the analog dot product operation to a first version of a digital dot product result value, wherein precision of the analog-to-digital converter performs a computation according to a function of a number of levels in a digital to analog converter (DAC), a height of the resistive memristor array, and a number of bits per cell; and
   a digital circuit to generate a digital dot product result value based on the first version of the digital dot product result value and the stored negation indicator.

2. The dot product engine of claim 1, wherein the resistive memory array stores at least one column of all logical ones.

3. The dot product engine of claim 2, wherein the resistive memory array performs a dot product operation on the input vector and the logical ones in the at least one column to generate an analog signal representing a sum of input values.

4. The dot product engine of claim 3, wherein the analog-to-digital converter converts the analog signal representing the sum of input values to a digital input sum value, and converts the analog signal representing the result of the dot product operation to a first version of the digital dot product result value.

5. The dot product engine of claim 4, wherein the digital circuit further comprises:
   an input sum register to store a digital current input sum based on the digital input sum value.

6. The dot product engine of claim 5, wherein the digital circuit further comprises:
   a subtract circuit to subtract the first version of the digital dot product result value from the digital current input sum stored in the input sum register to generate a second version of the digital dot product result value.

7. The dot product engine of claim 6, wherein the digital circuit further comprises:
   a multiplexer to selectively output one of the first version or the second version of the digital dot product result value based on the stored negation indicator.

8. The dot product engine of claim 1, wherein the stored negation indicator is a 1-bit value that is stored as part of a negation vector that indicates for each column of the memory array whether the elements in that column have been negated.

9. The dot product engine of claim 1, wherein the resistive memory array is a memristor array.

10. The dot product engine of claim 1, wherein the analog-to-digital converter (ADC) is a 6-bit ADC.

11. The dot product engine of claim 1, wherein the input vector is a 128-bit vector.

12. The dot product engine of claim 1, wherein the analog-to-digital converter outputs the first version of the digital dot product result value to a multiplexer and a subtract circuit.

13. The dot product engine of claim 1, wherein the digital circuit further comprises:
   an input sum register to store a digital current input sum based on the analog signal.

14. The dot product engine of claim 1, wherein the digital circuit further comprises:
   a multiplexer to selectively output one of the first version of the digital dot product result value or a second version of the digital dot product result value based on the stored negation indicator.

15. A method, comprising:
   providing an input vector to a resistive memory array of a dot product engine;
   performing an analog dot product operation on the input vector and a stored vector stored in the memory array to generate an analog signal by the memory array representing a result of the dot product operation;
   converting the analog signal representing the result of the analog dot product operation to a first version of a digital dot product result value by an analog-to-digital converter, wherein precision of the analog-to-digital converter performs a computation in the dot product engine according to a function of a number of levels in a digital to analog converter (DAC), a height of the resistive memristor array, and a number of bits per cell; and generating a digital dot product result value based on the first version of the digital dot product result value and a stored negation indicator that indicates whether elements of the stored vector have been negated.

16. The method of claim 15, and further comprising:

storing at least one vector of logical ones in the resistive memory; and performing an analog dot product operation on the input vector and the at least one vector of logical ones to generate an analog signal representing a sum of input values.

17. The method of claim 16, and further comprising:

generating a current digital input sum based on the analog signal representing the sum of input values.

18. The method of claim 17, and further comprising:

subtracting the first version of the digital dot product result value from the current digital input sum to generate a second version of the digital dot product result value; and selectively outputting one of the first version or the second version of the digital dot product result value based on the stored negation indicator.

19. A memristor dot product engine, comprising:

a memristor array to receive an input vector, perform an analog dot product operation on the input vector and a stored vector stored in the memristor array, and output an analog signal representing a result of the analog dot product operation;

a register to store an input sum value based on a summation of elements of the input vector;

an analog-to-digital converter to convert the analog signal representing the result of the analog dot product operation to a first version of a digital dot product result value, wherein precision of the analog-to-digital converter performs a computation according to a function of a number of levels in a digital to analog converter (DAC), a height of the resistive memristor array, and a number of bits per cell; and digital circuitry to generate a digital dot product result value based on the first version of the digital dot product result value, the input sum value, and a stored negation indicator that indicates whether elements of the stored vector have been negated.

20. The memristor dot product engine of claim 19, wherein the memristor array performs a dot product operation on the input vector and logical ones stored in at least one column of the array to generate a second analog signal representing a sum of input values, and wherein the input sum value stored in the register is generated based on the analog signal representing the sum of input values.

* * * * *